(12) United States Patent
Hause et al.

(10) Patent No.: US 6,514,858 B1
(45) Date of Patent: Feb. 4, 2003

(54) TEST STRUCTURE FOR PROVIDING DEPTH OF POLISH FEEDBACK

(75) Inventors: Frederick N. Hause, Austin, TX (US);
Paul R. Besser, Austin, TX (US);
Frank Mauersberger, Radebeul (DE);
Errol Todd Ryan, Austin, TX (US);
William S. Brennan, Austin, TX (US);
John A. Iacoponi, Austin, TX (US);
Peter J. Beckage, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/829,202

(22) Filed: Apr. 9, 2001

(51) Int. Cl.[7] ............. H01L 21/4763; G01L 21/30; G01R 31/00; C23F 3/00
(52) U.S. Cl. ............. 438/640; 438/638; 438/639; 438/701; 216/59; 216/84
(58) Field of Search ............. 438/8, 9, 640, 438/459, 701, 638, 639; 451/5, 8, 17; 216/59, 84

(56) References Cited

U.S. PATENT DOCUMENTS

| | | | |
|---|---|---|---|
| 5,736,427 A | * 4/1998 | Henderson | 438/14 |
| 6,136,709 A | * 10/2000 | Schmidbauer et al. | 438/688 |
| 6,214,716 B1 | * 4/2001 | Akram | 438/612 |
| 6,274,483 B1 | * 8/2001 | Chang et al. | 438/640 |
| 6,297,156 B1 | * 10/2001 | Farar et al. | 438/687 |
| 6,306,737 B1 | * 10/2001 | Mehrad et al. | 438/524 |

* cited by examiner

Primary Examiner—John F. Niebling
Assistant Examiner—Viktor Simkovic
(74) Attorney, Agent, or Firm—Williams, Morgan & Amerson

(57) ABSTRACT

A test structure useful in controlling a polishing process of a semiconductor device is provided. The test structure is comprised of a structure layer, a first process layer, and interconnects. The first process layer is positioned above the structure layer and has a plurality of openings formed therein and extending at least partially therethrough to a preselected depth. At least a portion of the plurality of openings have a tapered region progressively narrowing in a direction from the first process layer toward the structure layer. The openings are spaced a preselected distance X apart. The interconnects are formed in the plurality of openings including the tapered region. Thus, as the process layer and interconnects are removed by the polishing process, the distance X increases, indicating the depth of the polishing process.

16 Claims, 8 Drawing Sheets

TEST STRUCTURE FOR PROVIDING DEPTH OF POLISH FEEDBACK

BACKGROUND OF THE INVENTION

1. Field of the Invention

This invention relates generally to semiconductor processing, and more particularly, to a test structure capable of providing feedback information during a chemical mechanical polishing (CMP) process.

2. Description of the Related Art

CMP is widely used to planarize and generally remove process layers on semiconductor wafers. CMP typically utilizes an abrasive slurry disbursed in an alkaline or acidic solution to remove and/or planarize the surface of the wafer through a combination of mechanical and chemical action. Generally, a chemical mechanical polishing tool includes a polishing device positioned above a rotatable circular platen or table on which a polishing pad is mounted or above a semi-rigid linearly-moving belt on which a polishing pad is mounted. The polishing device may include one or more rotating carrier heads to which wafers may be secured, typically through the use of vacuum pressure. In use, the platen may be rotated and an abrasive slurry may be dispersed onto the polishing pad. Once the slurry has been applied to the polishing pad, a downward force may be applied to each rotating carrier head to press the attached wafer against the polishing pad. As the wafer is pressed against the polishing pad, a surface of a process layer formed above the wafer is mechanically and chemically polished.

A variety of systems have been proposed to determine an endpoint of the polishing process. For example, some systems estimate the time needed to polish the surface of the wafer to a desired depth. As is to be expected, any variations in the chemical or mechanical make up of the slurry, the pad, or the wafer may cause the amount of time needed to polish to the desired depth to vary dramatically.

Other systems rely on variations in resistance as an indication that the polishing process has reached the desired level. That is, as the polishing process removes one layer and begins to remove an underlying layer, the resistance to the polishing process may be seen to vary. For example, current applied to a motor that drives the polishing pad may change as the polishing process moves into the underlying layer. This system is not effective where the underlying layer has a similar resistance to the polishing process. Further, this system also suffers from shortcomings arising out of the fact that resistance variations may not be solely attributed to changes in the type of material being processed. Variations in the slurry or polishing pad may also affect resistance to the polishing process.

Additional systems that measure the chemical make up of the residue from the polishing process have also been used to detect polish endpoint. These systems look for the presence of certain materials unique to the underlying layer in the residue of the polishing process. Once these materials are observed, the system assumes that the polishing process has reached the underlying layer and should be discontinued. This system also suffers from certain shortcomings. For example, nonuniform polishing may go undetected. That is, the underlying layer may be reached by the polishing process in some areas, while other areas remain with significant portions of the overlying area still covering the underlying area. The residue may not reflect this nonuniform polishing.

The present invention is directed to overcoming, or at least reducing the effects of, one or more of the problems set forth above.

SUMMARY OF THE INVENTION

In one aspect of the present invention, a test structure in a semiconductor device is provided. The test structure is comprised of a structure layer, a first process layer, and interconnects. The first process layer is positioned above the structure layer and has a plurality of openings formed therein and extending at least partially therethrough to a preselected depth. At least a portion of the plurality of openings have a tapered region progressively narrowing in a direction from the first process layer toward the structure layer. The openings are spaced a preselected distance X apart. The interconnects are formed in the plurality of openings including the tapered region.

In another aspect of the present invention, a method is provided for forming a test structure in a semiconductor device. A first process layer is formed above a first structure layer, and first and second openings are formed in the first process layer. At least one of the first and second openings has a tapered region progressively narrowing in a direction from the first process layer toward the structure layer. Material is deposited in the first and second openings including the tapered region.

In yet another aspect of the present invention, a method for controlling a polishing process of a semiconductor device is provided. A first process layer is formed above a first structure layer. First and second openings are formed in the first process layer, with at least one of said first and second openings having a tapered region progressively narrowing in a direction from the first process layer toward the structure layer. The openings are spaced a preselected distance X apart. Material is deposited in the first and second openings including the tapered region. The first process layer and the material deposited in the first and second openings is polished. The spacing X between the plurality of openings at the polished surface of the first process layer is measured and compared to a desired spacing. The polishing process of the first process layer and the material deposited in the first and second openings continues in response to the measured spacing X being less than the desired spacing.

BRIEF DESCRIPTION OF THE DRAWINGS

The invention may be understood by reference to the following description taken in conjunction with the accompanying drawings, in which like reference numerals identify like elements, and in which.

Figure 1:
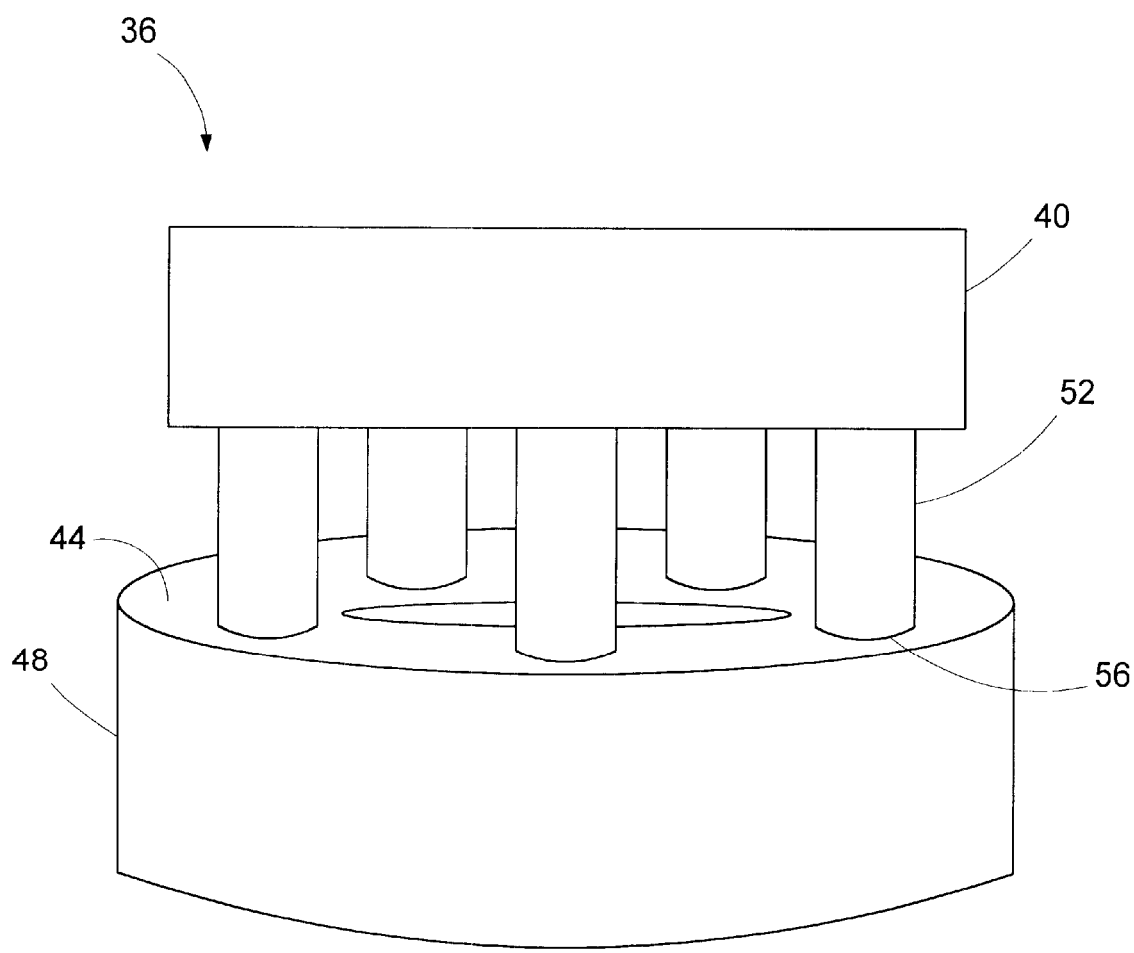
FIG. 1 illustrates a conventional polishing tool having multiple arms.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time consuming, but would nevertheless be a routine undertaking for those of ordinary skill in the art having the benefit of this disclosure.

In disclosing the present invention, reference will be made to the illustrative embodiment of the invention depicted in FIGS. 1–5. The relative sizes of the various features depicted in the drawings may be exaggerated or reduced as compared to the size of those feature sizes on actual devices. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed to a test structure useful during a CMP process to detect a polish end point. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Referring to FIG. 1, an exemplary multiple arm polishing tool 36 is shown. The exemplary polishing tool 36 may be comprised of a multi-head carrier 40 positioned above a polishing pad 44 that is mounted on a rotatable platen 48. The multi-head carrier 40 typically includes a plurality of rotatable polishing arms 52, each of which includes a carrier head 56. Wafers (not shown) may be secured to the carrier heads 56 using known techniques, such as vacuum pressure. A source of polishing fluid (not shown) may be provided to supply polishing fluid (e.g., slurry) to the polishing pad 44. Furthermore, although five polishing arms 52 are shown, the polishing tool 36 may be comprised of any number of polishing arms 52. For example, in one embodiment, the polishing tool 36 is comprised of only a single polishing arm 52, and each wafer is polished individually.

Figure 2:
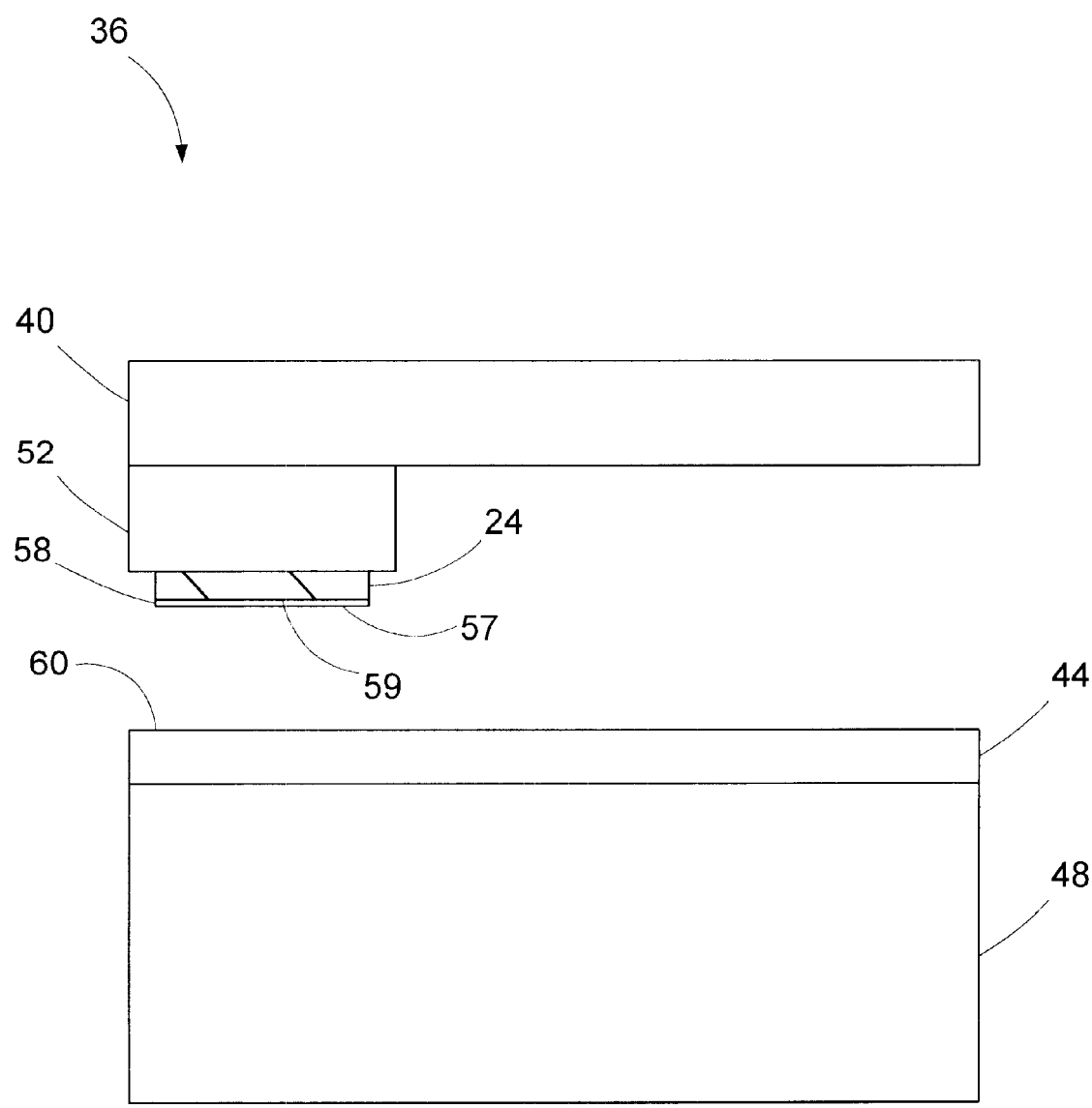
FIG. 2 is a simplified side-view of the polishing tool illustrated in FIG. 1.

Referring to FIG. 2, a simplified side-view of a portion of the illustrative polishing tool 36 is shown. To simplify illustration of the operation of the polishing tool 36, only one polishing arm 52 is shown. Again, the polishing pad 44 may be fixed to the rotatable platen 48. A wafer 24 is coupled to the rotatable polishing arm 52 using, for example, vacuum pressure, and the polishing arm 52 may be coupled to the carrier 40. To effectuate polishing, the polishing arm 52 may be extended such that a polishing surface 57 of a process layer 58 formed above a surface 59 of the wafer 24 is pressed against a polishing surface 60 of the polishing pad 44. Furthermore, the platen 48 may be rotated, typically at a constant speed. Moreover, a variable downward force may be applied to the polishing arm 52, and the polishing arm 52 may be rotated and oscillated back and forth across the polishing pad 44.

Figure 3A:
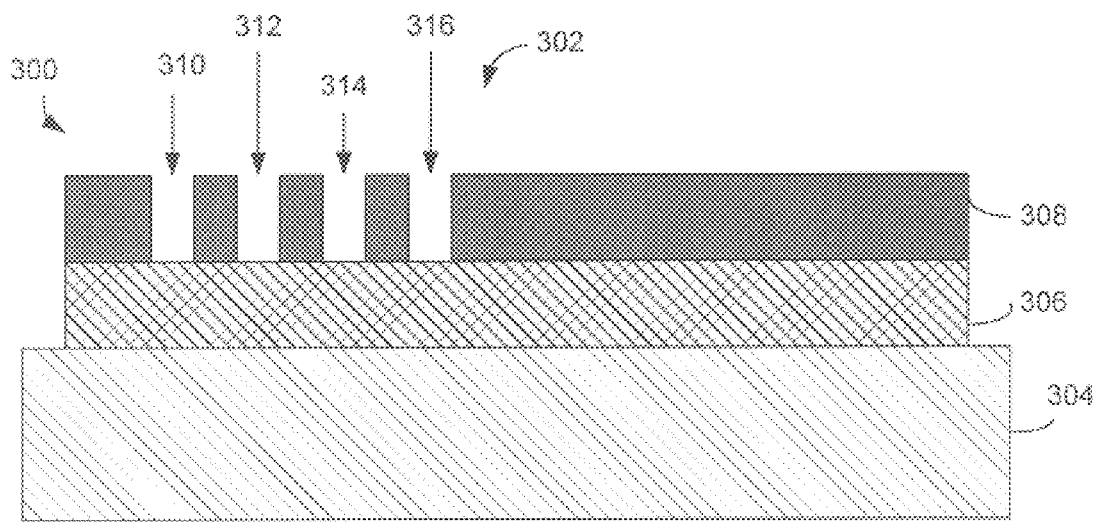
FIGS. 3A–3F show a series of steps in the formation of a test structure having characteristics of the present invention.
Figure 3B:
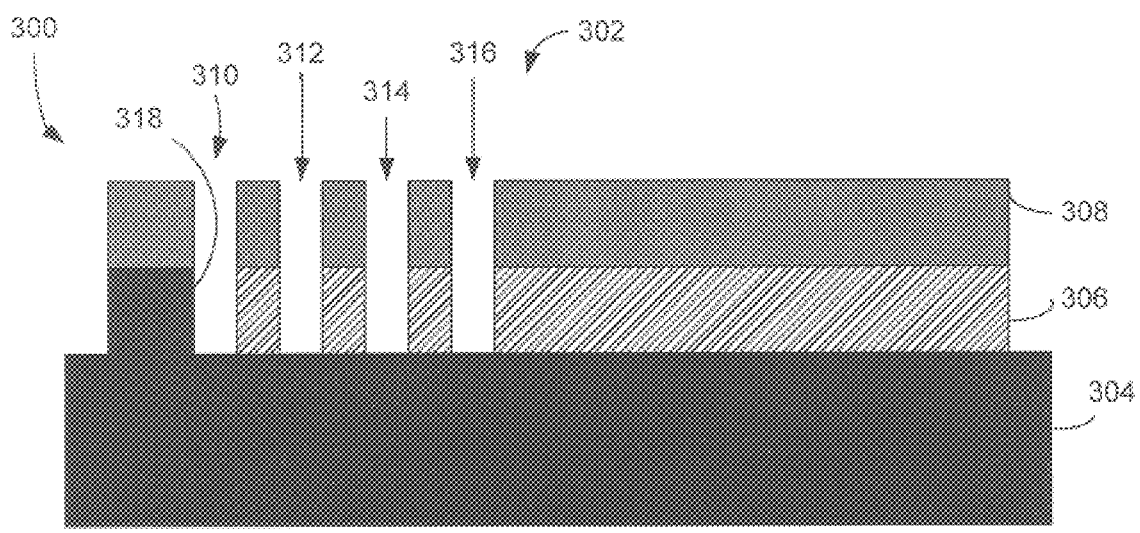

Turning now to FIG. 3A, a side view of a portion of a semiconductor wafer 300 in which a test structure 302 is in the process of being constructed, is shown. The test structure 302 is useful in determining an end point of the polishing process effected by the polishing tool 36. The wafer 300 generally comprises a structure layer 304, such as a semiconducting substrate, and a process layer 306 disposed thereabove. However, the present invention is not limited to the formation of the test structure 302 above the surface of a semiconducting substrate such as a silicon wafer. Rather, as will be apparent to one skilled in the art upon a complete reading of the present disclosure, the test structure 302 may be formed above previously formed semiconductor devices and/or process layer, e.g., transistors, or other similar structure. In effect, the present invention may be used to form the test structure 302 on top of previously formed process layers. The structure layer 304 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers and/or an interlevel (or interlayer) dielectric (ILD) layer or layers, and the like.

According to one embodiment of the present invention, the process layer 306 is a dielectric layer formed above the structure layer 304. An etch stop layer (ESL) (not shown) (typically silicon nitride, $Si_3N_4$, or SiN, for short) may be disposed between the dielectric layer 306 and the structure layer 304.

The dielectric layer 306 may be formed from a variety of dielectric materials, including, but not limited to, materials having a relatively low dielectric constant (low K materials, where K is less than or equal to about 4), although the dielectric materials need not have low dielectric constants. The dielectric layer 306 may be formed by a variety of known techniques for forming such layers, e.g, a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and each may have a thickness ranging from approximately 3000 Å–8000 Å, for example.

The dielectric layer 306 may be formed from a variety of dielectric materials, such as Applied Material's Black Diamond®, Novellus' Coral®, Allied Signal's Nanoglass®, JSR's LKD5104, and the like. In one illustrative embodiment, the dielectric layer 306 is comprised of Applied Material's Black Diamond®, having a thickness of approximately 5000 Å and formed by being blanket-deposited by an LPCVD process for higher throughput.

A patterned photomask 308 is formed over the process layer 306 using conventional photolithography techniques. For example, openings, such as openings or trenches 310, 312, 314, 316, are formed above at least a portion of the structure layer 304 to begin the process of forming the test structure 302. Openings or trenches for conductive metal lines, contact holes, via holes, and the like, are etched into the dielectric layer 302. The openings 310, 312, 314, 316 have generally vertical sidewalls 318. The openings 310, 312, 314, 316 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used in various illustrative embodiments. The etching may stop at the structure layer 304 or any etch stop layer, if present.

Figure 3C:
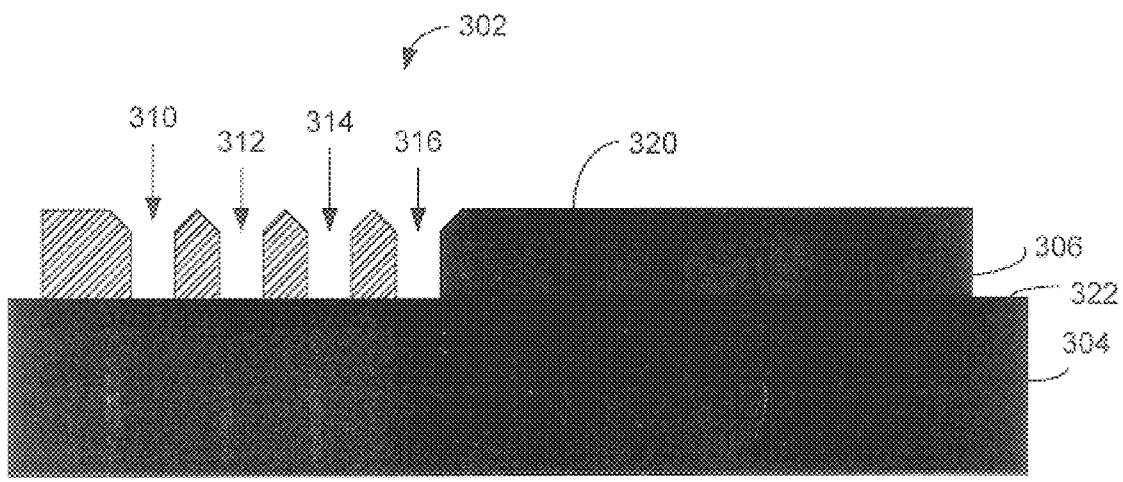

As shown in FIG. 3C, the patterned photomask 308 (FIGS. 3A–3B) is stripped off, by ashing, for example.

Alternatively, the patterned photomask 308 may be stripped using a 1:1 solution of sulfuric acid (H$_2$SO$_4$) to hydrogen peroxide (H$_2$O$_2$), for example. Thereafter, upper portions of the openings 310, 312, 314, 316 are widened to provide a cross section that progressively narrows or tapers in a direction from an upper surface 320 of the process layer 306 toward an upper surface 322 of the structure layer 304. The cross sectional variation shown in conjunction with the embodiment described in FIGS. 3C is generally linear, however, other cross sections are envisioned, as described further below in conjunction with FIG. 4.

Widening of the openings 310, 312, 314, 316 may be accomplished by faceting the sidewalls 318 of the openings 310, 312, 314, 316 using, for example, an angular ablating process. Alternatively, a conventional sputter etching process may also be employed, as it has a relatively high etch rate of exposed corners, thus producing an opening that varies in cross section from relatively wide adjacent the upper surface 320 of the process layer 306 to relatively narrow adjacent an upper surface 322 of the structure layer 304.

In an alternative embodiment, an isotropic etching process may be used to form an upper portion of the openings 310, 312, 314, 316. Subsequently, an anisotropic etching process may be used to complete the formation of the openings 310, 312, 314, 316. The isotropic etching process will produce an upper region with tapered sidewalls, whereas the anisotropic process will produce a lower region with substantially vertical sidewalls.

Figure 3D:
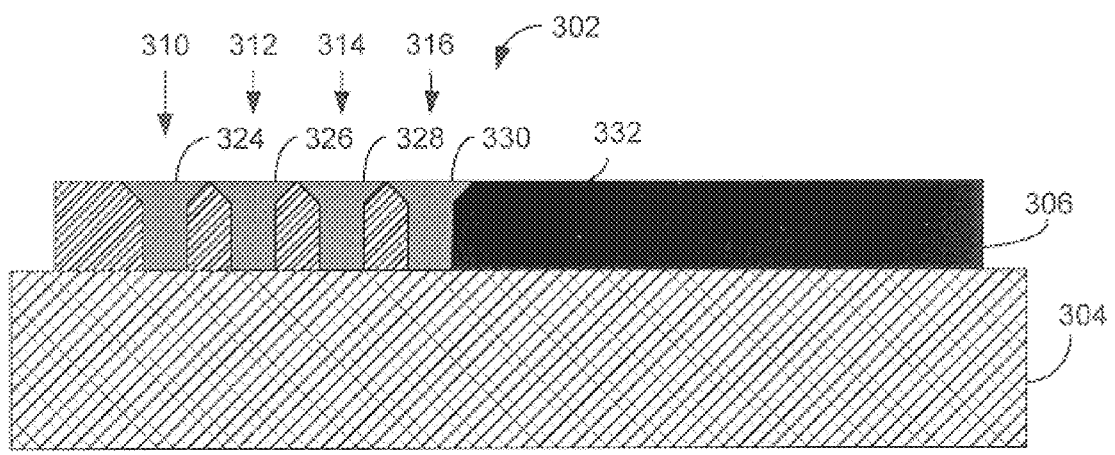

As shown in FIG. 3D, the openings 310, 312, 314, 316 have been filled with a process material, such as copper, aluminum, titanium, tungsten or the like, to form metal interconnects 324, 326, 328, 330. While not illustrated herein, those skilled in the art will appreciate that a barrier layer may be used to enhance adhesion between the metal layer and the underlying layer. Each of the metal interconnects 324, 326, 328, 330 has a tapered region 332, owing to the faceted sidewalls 318 of the openings 310, 312, 314, 316. The interconnects 324, 326, 328, 330 may be formed by any suitable technique, such as by a selective process, such as electroless deposition, that fills only the openings 310, 312, 314, 316 with the desired metal, leaving the surface 320 of the process layer 306 substantially free of the deposited metal. Alternatively, a conformal layer of metal (not shown) may be deposited over the surface of the process layer 306 and in the openings 310, 312, 314, 316. The deposited layer of metal (not shown) may be polished, ground, or etched to produce the interconnects 324, 326, 328, 330 illustrated in FIG. 3D.

Figure 3E:
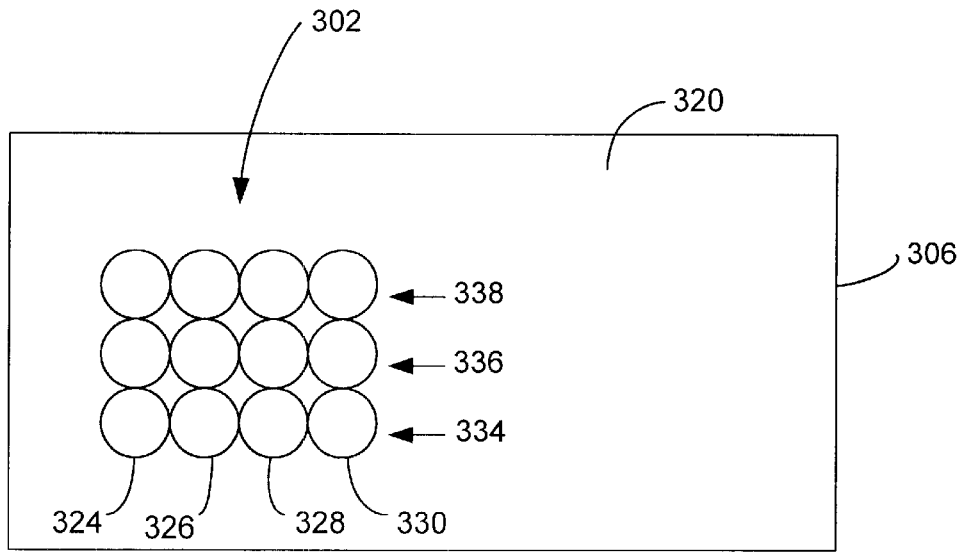
Figure 3F:
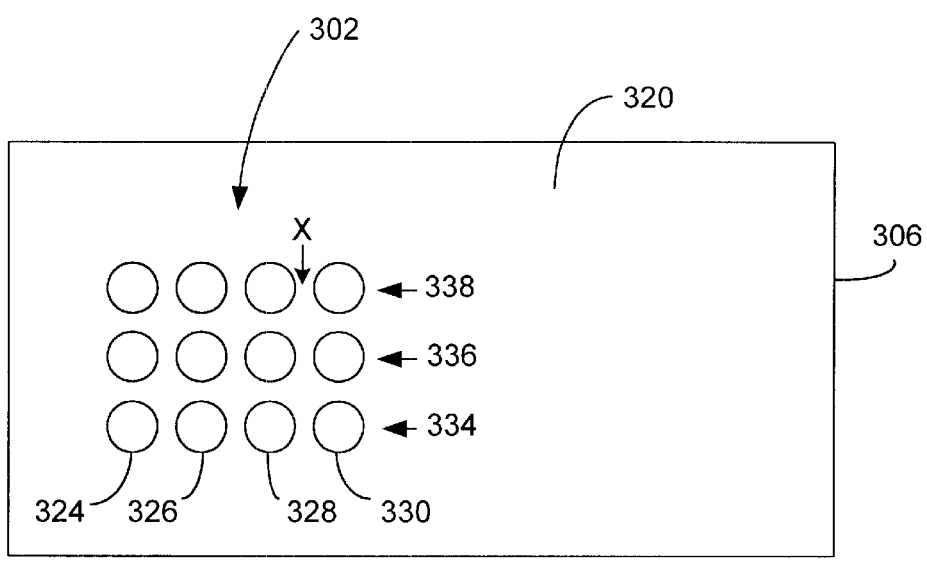

A top view of the process layer 306 of FIG. 3D is illustrated in FIG. 3E. In the illustrated embodiment, three rows 334, 336, 338 of the interconnects 324, 326, 328, 330 are arranged in an array. The interconnects 324, 326, 328, 330 are adjacent one another, and in some embodiments may be touching to substantially form a sheet of metal, as viewed from above. While an array of twelve interconnects 324, 326, 328, 330 is illustrated, it should be appreciated that more or fewer interconnects 324, 326, 328, 330 may be used without departing from the spirit and scope of the instant invention.

Thus, as the process layer 306 and interconnects 324, 326, 328, 330 are further polished, the polishing process removes the upper portion of the tapered region 332. As the upper portion of the tapered region 332 is removed, the diameter of the interconnects 324, 326, 328, 330 is reduced, causing the interconnects 324, 326, 328, 330 to be progressively separated from one another, as viewed from above and illustrated in FIG. 3F. The distance X that the interconnects 324, 326, 328, 330 are separated from one another may be used as an indication of the depth of the polishing process. The test structure 302 may be periodically inspected to monitor the progress of the polishing process. This inspection may be a manual or automated process.

Figure 4A:
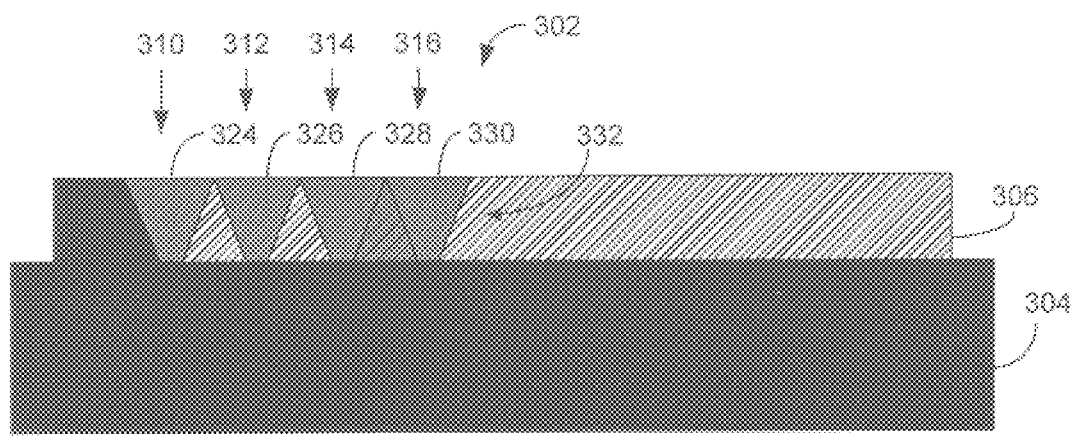
FIGS. 4A–4D show alternative embodiments of the test structure of the present invention.

Alternative constructions of the interconnects 324, 326, 328, 330 are illustrated in FIGS. 4A–4D. For example, FIG. 4A illustrates the interconnects 324, 326, 328, 330 with the tapered portion 332 extending substantially the entire length of the interconnects 324, 326, 328, 330. The structure illustrated in FIG. 4A may be useful, as the depth of the polishing process may be derived at any point along the entire length of the interconnects 324, 326, 328, 330 based on the spacing X.

Figure 4B:
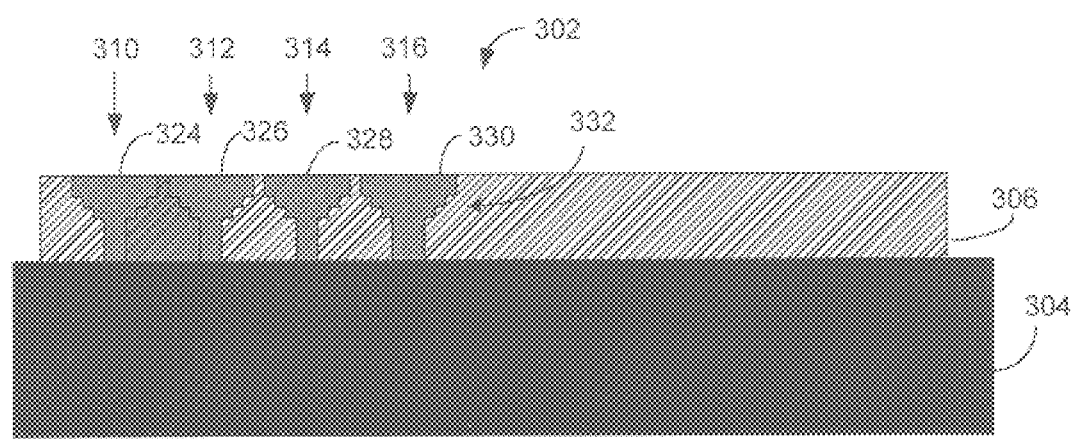

FIG. 4B illustrates the interconnects 324, 326, 328, 330 wherein the tapered portion 332 is constructed in steps, as opposed to varying linearly. This stepped construction may be useful to more definitively define select depths within the process layer 306. That is, as the polishing process passes through each step, a dramatic difference in the spacing X may be readily observed.

Figure 4C:
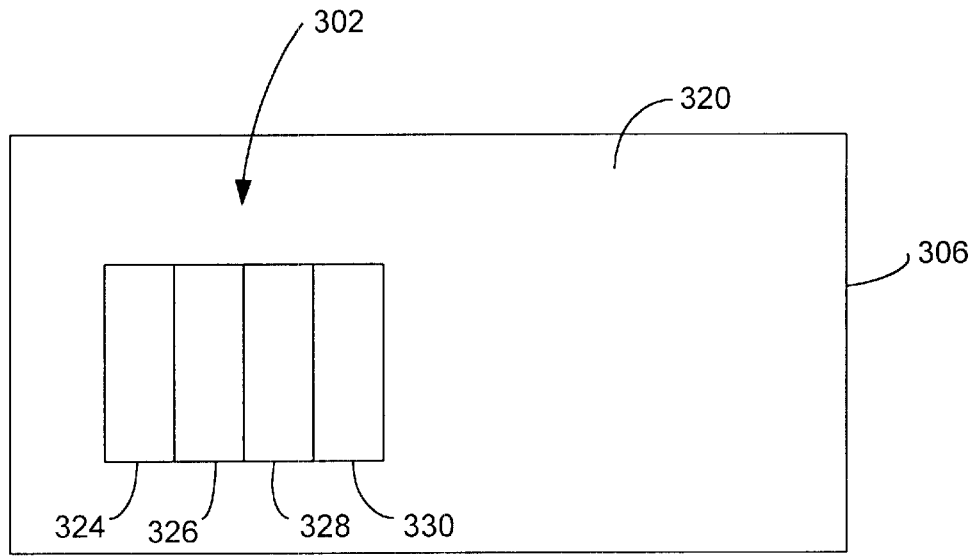

A top view of an alternative embodiment of the process layer 306 of FIG. 3D is illustrated in FIG. 4C. In the illustrated embodiment, the interconnects 324, 326, 328, 330 are in the form of trenches and are arranged in an array. The interconnects 324, 326, 328, 330 are adjacent one another, and in some embodiments may be touching so as to substantially form a sheet of metal, as viewed from above.

Figure 4D:
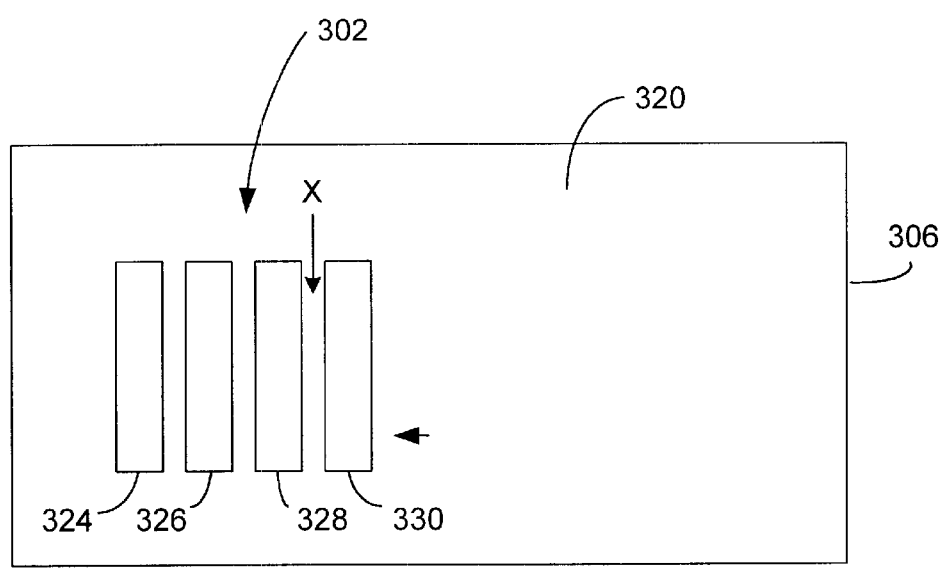

Thus, as the process layer 306 and interconnects 324, 326, 328, 330 are further polished, the polishing process removes the upper portion of the tapered region 332. As the upper portion of the tapered region 332 is removed, the width of the interconnects 324, 326, 328, 330 is reduced, causing the interconnects 324, 326, 328, 330 to be progressively separated from one another, as illustrated in FIG. 4D. The distance X that the interconnects 324, 326, 328, 330 are separated from one another may be used as an indication of the depth of the polishing process. The test structure 302 may be periodically inspected to monitor the progress of the polishing process. This inspection may be a manual or automated process.

It should be appreciated that the test structure 302 may be positioned at a plurality of locations on the wafer 300. Observation of the test structure 302 at a plurality of locations on the wafer 300 may be used to more uniformly control the polishing process, or at least to identify nonuniform polishing characteristics.

Figure 5:
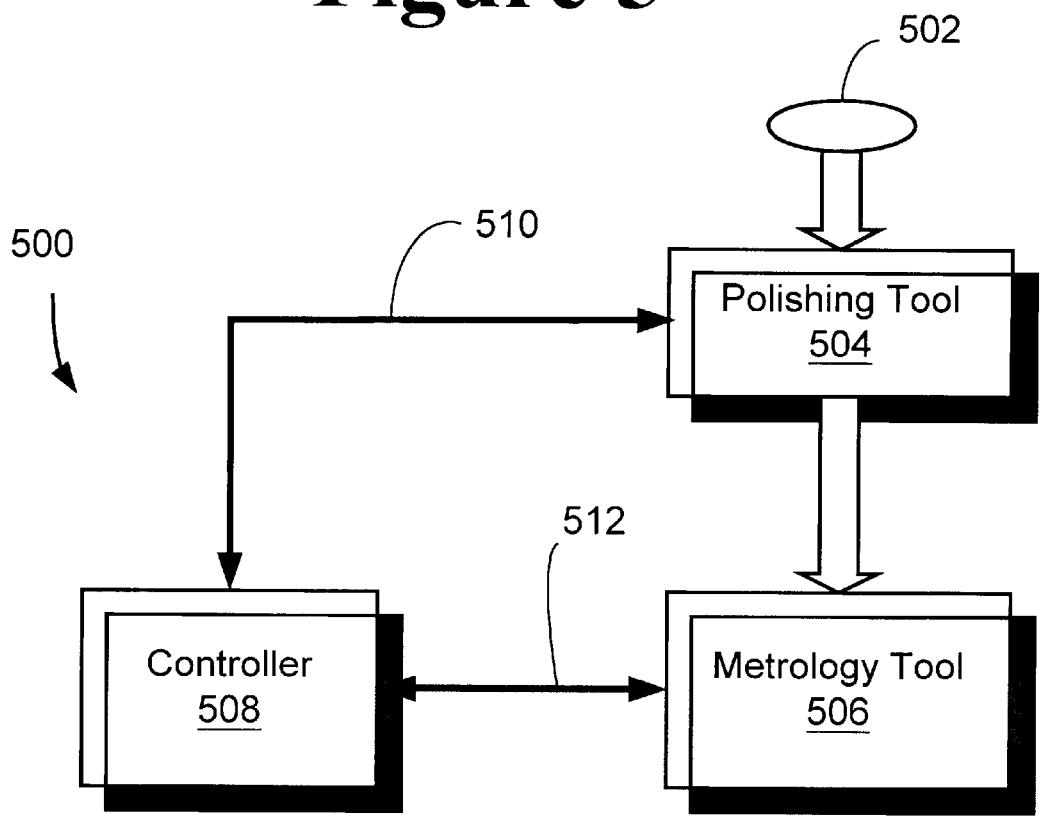
FIG. 5 illustrates a control system that may be used in combination with the test structure of FIGS. 3 and 4.

Referring to FIG. 5, an exemplary control system 500 for a polishing tool 504 is shown. Generally, a variety of control systems may be used with the present invention. Furthermore, because any number of control systems may be implemented, the exemplary control system 500 described herein should not be considered as a limitation of the present invention.

Turning now to FIG. 5, one illustrative embodiment of a system 500 that may be used to produce the features of the semiconductor device depicted in FIGS. 3 and 4 is shown. The system 500 processes wafers 502 and is generally comprised of a polishing tool 504, a metrology tool 506, and a controller 508. Generally, the polishing tool 504 removes at least a portion of the process layer 306 and one or more test structures 302.

The metrology tool 506 may be used at various stages of the process to measure select parameters of the test structure 302, such as physical spacing between the interconnects 324, 326, 328, 330. In some embodiments, the metrology tool 506 may not be needed, as sufficient feedback information for controlling parameters of the polishing tool 504 may be obtained from sensors within the polishing tool 504.

The metrology tool 506 may be any of a variety of devices used to measure the structural features on the wafer 502 after or while being processed by the polishing tool 504. For example, the metrology tool 506 may take the form of a variety of different metrology tools, such as a dimension optic force profiler available from Veeco, a scanning electron microscope available from Jeol, a high resolution profilometer available from KLA Tencor, and the like. It is contemplated that in some embodiments of the instant invention additional tools (not shown) may be deployed in the manufacturing line, such as etchers, steppers, electroplating tools, deposition tools, and the like. These additional devices may perform additional processes needed to produce the features described in FIGS. 3 and 4.

The controller 508 of FIG. 5 may take a variety of forms. For example, the controller 508 may be included within the tools 504–506, or it may be a separate device electrically coupled to the tools 504–506 via lines 510, 512, respectively. In the embodiment illustrated herein, the controller 508 takes the form of a computer that is controlled by a variety of software programs. Those of ordinary skill in the art having the benefit of this disclosure will appreciate that the controller 508 need not rely on software for its functionality, but rather, a hardware controller may be used to provide the functionality described herein and attributed to the controller 508. Further, the controller 508 need not be coupled only to the tools 504–506, but rather, could be coupled to and involved in controlling or collecting data from other devices involved in the manufacture of semiconductor devices.

In the illustrated embodiment, the automatic process controller 508 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed.

An exemplary software system capable of being adapted to perform the functions of the automatic process controller 508, as described, is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Generally, the controller 508 receives data from either the metrology tool 506 or sensors (not shown) located within the polishing tool 504. The data reflects the spacing X between the interconnects 324, 326, 328, 330. As long as the measured spacing X is less than a target value, the controller 508 instructs the polishing tool 504 to continue polishing the wafer 502. As the measured spacing X approaches and reaches the target value, the controller 508 instructs the polishing tool 504 to end the polishing process and move on to the next batch of wafers 502.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a test structure in a semiconductor device, comprising:

forming a first process layer above a first structure layer;

forming first and second openings in the first process layer, at least one of said first and second openings having a tapered region progressively narrowing in a direction from the first process layer toward the structure layer; and depositing material in the first and second openings including the tapered region, where a distance between the first and second openings in the tapered region indicates a depth by which the first process layer is polished.

2. The method of claim 1, wherein forming the first process layer comprises forming a dielectric layer using at least one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

3. The method of claim 1, wherein forming the first and second openings in the first process layer comprises forming the first and second openings in the first process layer using a mask of photoresist, the the mask of photoresist being formed and patterned above the first process layer.

4. The method of claim 1, wherein depositing material in the first and second openings including the tapered region further comprises depositing a metal in the first and second openings including the tapered region.

5. The method of claim 4, wherein depositing metal in the first and second openings including the tapered region further comprises using an electroless deposition process.

6. The method of claim 4, wherein depositing metal in the first and second openings including the tapered region further comprises depositing a conformal coating of metal over a surface of the process layer and within the first and second openings, including the tapered region.

7. The method of claim 4, wherein forming first and second openings in the first process layer, at least one of said first and second openings having a tapered region progressively narrowing in a direction from the first process layer toward the structure layer further comprises faceting sidewalls of at least one of the first and second openings to produce the tapered region.

8. The method of claim 7, wherein faceting the sidewalls of the first and second openings to produce the tapered regions further comprises performing an isotropic etch followed by an anisotropic etch.

9. A method for controlling a polishing process of a semiconductor device, comprising:

forming a first process layer above a first structure layer;

forming first and second openings in the first process layer, at least one of said first and second openings having a tapered region progressively narrowing in a direction from the first process layer toward the structure layer, said openings being spaced a preselected distance X apart;

depositing material in the first and second openings including the tapered region;

polishing the first process layer and the material deposited in the first and second openings;

measuring a spacing between the first and second openings at the polished surface of the first process layer;

comparing the measured spacing to a desired spacing; and continuing the polishing of the first process layer and the material deposited in the first and second openings in response to the measured spacing being less than the desired spacing.

10. The method of claim 9, wherein forming the first process layer comprises forming a dielectric layer using at least one of a chemical vapor deposition (CVD) process, a low-pressure CVD (LPCVD) process, a plasma-enhanced CVD (PECVD) process, a sputtering process, a physical vapor deposition (PVD) process, and a spin-on coating process.

11. The method of claim 9, wherein forming the first and second openings in the first process layer comprises forming the first and second openings in the first process layer using a mask of photoresist, the mask of photoresist being formed and patterned above the first process layer.

12. The method of claim 9, wherein depositing material in the first and second openings including the tapered region further comprises depositing a metal in the first and second openings including the tapered region.

13. The method of claim 12, wherein depositing metal in the first and second openings including the tapered region further comprises using an electroless deposition process.

14. The method of claim 12, wherein depositing the metal in the first and second openings including the tapered region further comprises depositing a conformal coating of metal over a surface of the process layer and within the first and second openings, including the tapered region.

15. The method of claim 12, wherein forming the first and second openings in the first process layer, at least one of said first and second openings having a tapered region progressively narrowing in a direction from the first process layer toward the structure layer further comprises faceting sidewalls of at least one of the first and second openings to produce the tapered region.

16. The method of claim 9, further comprising:

forming third and fourth openings in the first process layer at a location remote from the first and second openings, at least one of said third and fourth openings having a tapered region progressively narrowing in a direction from the first process layer toward the structure layer, said third and fourth openings being spaced a preselected distance X apart;

depositing material in the third and fourth openings including the tapered region; and measuring the spacing between the third and fourth openings at the polished surface of the first process layer.

* * * * *